(12) United States Patent
Peterson et al.

(10) Patent No.: US 10,383,225 B1
(45) Date of Patent: Aug. 13, 2019

(54) INTERPOSER WITH OFFSET-STACKED TRACES

(71) Applicant: Seagate Technology LLC, Cupertino, CA (US)

(72) Inventors: Michael J. Peterson, Prior Lake, MN (US); Michael R. Fabry, Apple Valley, MN (US); Sean M. Horgan, Shakopee, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 16/100,975

(22) Filed: Aug. 10, 2018

(51) Int. Cl.
| | |
|---|---|
| H01L 21/48 | (2006.01) |
| H01L 21/306 | (2006.01) |
| H01L 21/308 | (2006.01) |
| H01L 21/768 | (2006.01) |
| H01L 23/00 | (2006.01) |
| H01L 23/48 | (2006.01) |
| H01L 23/367 | (2006.01) |
| H01L 23/498 | (2006.01) |
| H01L 23/532 | (2006.01) |
| H05K 1/11 | (2006.01) |
| H05K 3/40 | (2006.01) |

(52) U.S. Cl.
CPC ............ *H05K 1/113* (2013.01); *H01L 21/486* (2013.01); *H01L 23/49827* (2013.01); *H05K 3/4038* (2013.01); *H05K 2201/029* (2013.01)

(58) Field of Classification Search
CPC ..... H01L 21/48; H01L 21/306; H01L 21/308; H01L 21/768; H01L 23/00; H01L 23/48; H01L 23/367; H01L 23/498; H01L 23/532

USPC ......... 174/262; 257/751, 773, 774; 438/643, 438/653; 228/159
See application file for complete search history.

(56) References Cited

U.S. PATENT DOCUMENTS

| | | |
|---|---|---|
| 6,617,681 B1 | 9/2003 | Bohr |
| 7,137,196 B2 | 11/2006 | Gunderson et al. |
| 9,331,043 B1 * | 5/2016 | Katkar ................... H01L 25/50 |
| 2012/0112779 A1 | 5/2012 | Smith et al. |
| 2014/0167267 A1 * | 6/2014 | Uzoh ................ H01L 21/76829 257/751 |
| 2015/0129646 A1 * | 5/2015 | Haba ....................... H01L 24/85 228/159 |
| 2015/0129647 A1 * | 5/2015 | Haba .................... B23K 20/004 228/159 |
| 2015/0255364 A1 * | 9/2015 | Gao ...................... H01L 23/481 257/774 |
| 2015/0262910 A1 * | 9/2015 | Sun ....................... H01L 23/481 327/306 |
| 2016/0343646 A1 * | 11/2016 | Alvarado ............ H01L 21/4857 |

* cited by examiner

*Primary Examiner* — Xiaoliang Chen
(74) *Attorney, Agent, or Firm* — Crawford Maunu PLLC

(57) ABSTRACT

Aspects of the disclosure are directed to apparatuses and methods involving an electrical connector and methods thereof. As may be consistent with one or more embodiments, an interposer includes respective barrier layers having barrier material that is coplanar with, and laterally surrounds, traces having connected via pads. Vias connect pads of stacked pairs of the traces in different ones of the barrier layers. The traces vary in width along their respective lengths. The barrier material is offset from each trace by a continuous gap having a length extending around the trace, with the gaps extending around each stacked pair being offset from one another along the majority of their respective lengths.

20 Claims, 7 Drawing Sheets

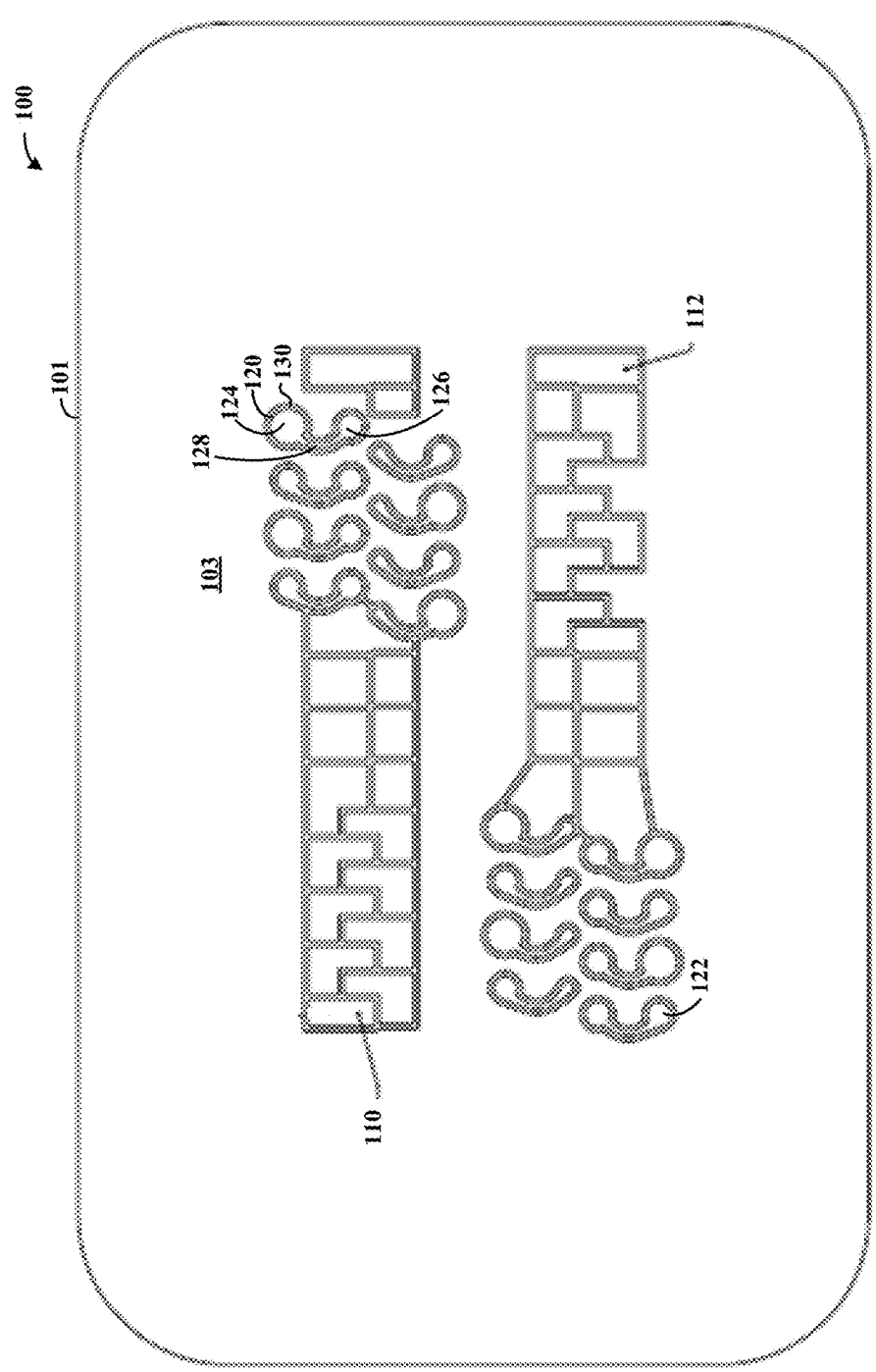

US 10,383,225 B1

INTERPOSER WITH OFFSET-STACKED TRACES

OVERVIEW

Various example embodiments are directed to methods and apparatuses involving interposers and their manufacture, with offset-stacked traces. In particular embodiments, traces in respective layers are offset so as to facilitate the mitigation of gas permeation, using conductive material in stacked layers to effectively block direct paths through the interposer. Various other aspects involve using a weave of material, such as fibers, in insulating or other layers of the interposer with the weaved material being stacked to also mitigate gas permeation, and block direct paths through some or all of the interposer.

Various such embodiments address issues that may relate to such gas permeation, which can present issues in sealed electronic equipment such as hard disc drives that are often filled with a gas such as helium. For instance, electrical signals and power must be passed through electrical enclosures, such as hard disc drive enclosures, for power and communications (e.g., reading and writing data). Interposers provide connectivity to do so, yet introduce the possibility of gas permeation. As such, aspects of the disclosure are directed to addressing potential issues with gas permeation, such as by reducing the number of pathways via which gas may permeate through the interposer, or otherwise making it more challenging for such gas to make its way through the interposer by increasing the length of any path by which the gas needs to permeate.

In accordance with one or more aspects of the disclosure, an apparatus and/or method involves an electrical connector with respective barrier layers having barrier material that is coplanar with, and laterally surrounds, traces. The traces have connected via pads and vary in width along their respective lengths, in a manner that may be utilized to mitigate gas permeation. Stacked pairs of the traces in overlapping regions of the barrier layers are connected by vias. The barrier material is offset from each trace to form a continuous gap having a length extending around the trace, with the gaps of each stacked pair of traces being offset from one another to mitigate gas permeation.

Certain embodiments are directed toward an electrical interposer apparatus having first and second surface layers on opposite sides of the electrical interposer, each layer including a plurality of electrical connectors. The apparatus further includes first and second barrier layers stacked between the first and second surface layers, each of the barrier layers including a plurality of conductive traces and conductive barrier material that is coplanar with and laterally surrounds the conductive traces. Each conductive trace includes respective via pads connected by a connector and has a width that varies along its length. The conductive barrier material is offset from the plurality of conductive traces by a continuous gap having a length extending around the conductive traces. A plurality of conductive vias connect the via pads of stacked pairs of the conductive traces, one of the stacked pairs being in the first barrier layer and the other of the stacked pairs being in the second barrier layer. The respective gaps extending around each stacked pair are offset from one another along the majority of the respective lengths of the gaps.

Further aspects of the disclosure are directed to a method of manufacturing an electrical interposer apparatus, in which first and second barrier layers are formed including a plurality of conductive traces and conductive barrier material that is coplanar with and laterally surrounds the conductive traces. Each of the barrier layers is formed with a plurality of conductive traces, each conductive trace including respective via pads connected by a connector and having a width that varies along its length. The conductive barrier material is formed offset from the plurality of conductive traces by a continuous gap having a length extending around the conductive traces. A plurality of conductive vias are formed connecting the via pads of stacked pairs of the conductive traces, in which one of the stacked pairs is in the first barrier layer and the other of the stacked pairs is in the second barrier layer. The resulting gaps extend around each stacked pair and offset from one another along the majority of the respective lengths of the gaps.

The above overview is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, as depicted herein.

FIGS. 1A-1C show respective views of an apparatus as may be implemented in accordance with one or more embodiments, in which:

FIG. 1A shows a top view of a first layer within the apparatus,

FIG. 1B shows a top view of a second layer within the apparatus, and

FIG. 1C shows a top view of the first and second layers in a stacked arrangement;

Figure 1B:
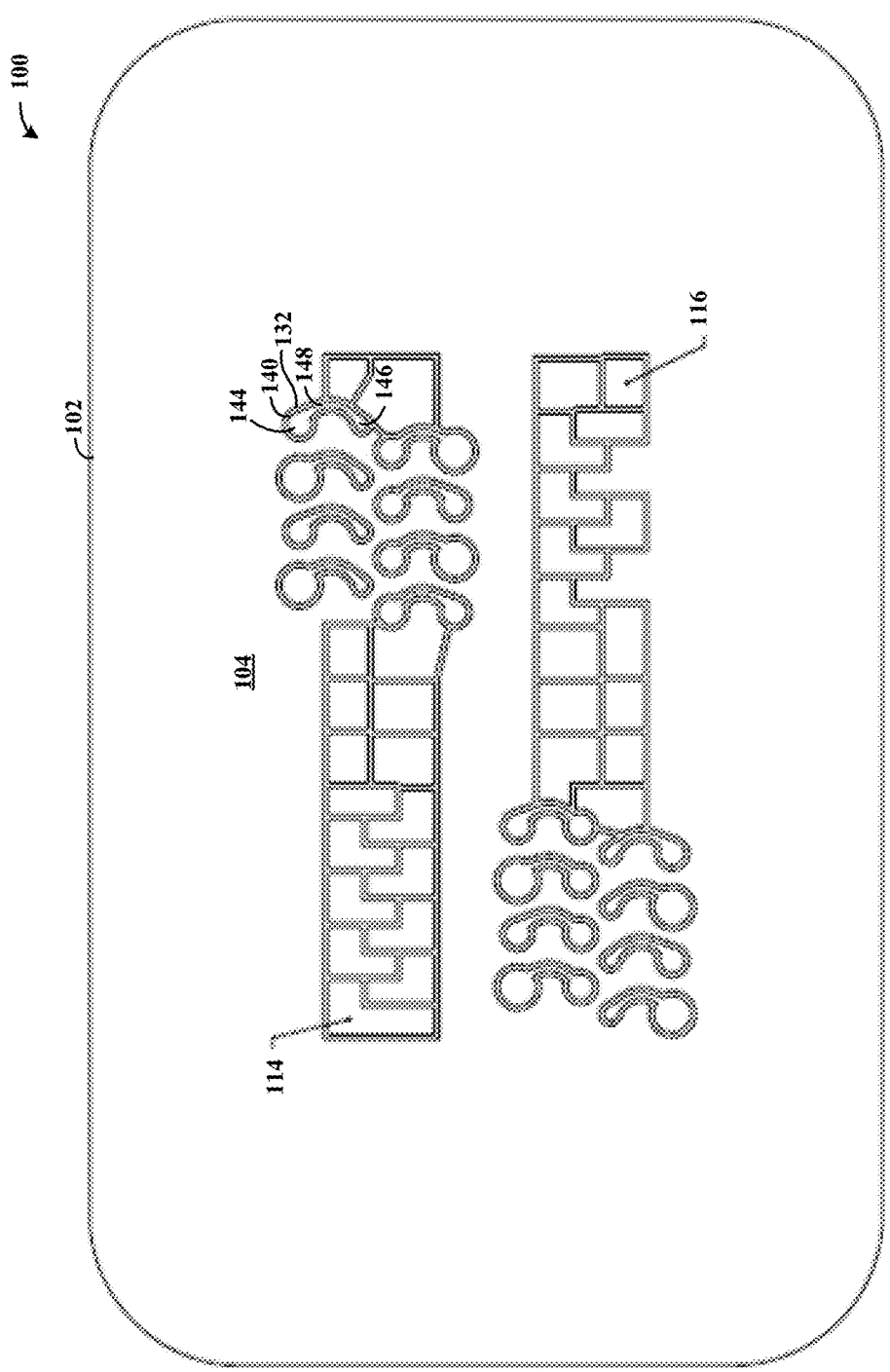

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving electrical connectors, and in particular, interposers that provide an electrical passageway for an enclosure. In certain implementations, aspects of the present disclosure have been shown to be beneficial when used in the context of mitigating gas permeation, as may be applicable to electronic componentry and enclosures, such as those involving the manufacture of hard disc drives. While not necessarily so limited, various aspects may be appreciated through a discussion of examples using such exemplary contexts.

Various embodiments involve providing structure within an electrical interposer, which mitigates gas permeation. The structure involves overlapping components, such as overlapping connectors, barrier layers or weave material, which act to hinder gas permeation. For example, components may be overlapped in respective layers, or within a particular layer, so as to reduce the amount of area in which a direct (or nearly direct) path for gas permeation exists. This forces gas to pass around the respective components, rather than straight through, which helps to reduce or eliminate gas permeation.

In various implementations, conductive vias, via pads and related connectors are provided in respective layers to facilitate electrical connectivity through an interposer. For instance, each respective surface of the interposer may include a conductive pad, via or other structure that operates to couple to an external connector. A conductive path extending through the interposer provides connection through the interposer, and includes stacked connector layers. Each conductive path includes a pair of stacked conductive traces, one in each of the respective layers, each having a via pad and a connector between the via pads. The conductive traces in each layer are separated from other conductive traces and barrier material within the layer by an insulative gap. The shapes of the connector and/or the via pads in the respective stacked conductive traces are different, as are the insulative gaps that extend around the conductive traces. This shape difference results in the gaps being largely offset from one another, which helps to mitigate gas permeation.

In a more particular embodiment, an interposer is a two sided printed circuit board interface that enables electrical connectivity of internal and external functions of gas-filled hard drives. The interposer may be implemented with compliant (e.g., non-ceramic) components, which may be less susceptible to cracking, and can be processed in a multi-array format. In various implementations, the interposer is a thin wafer-like structure with layers of electrical connectors and barrier material, with a perimeter edge of the structure being sealed. Manufacturing approaches may involve routing, etching, and epoxy deposition/growth.

In various embodiments, a four or six layer copper defined design stack is utilized to facilitate conductive connection with an enclosure, with structure that mitigates gas permeation. Such a design stack may be produced in a 1 mm form factor. Gas permeation may be mitigated by minimizing a Z-window ratio, utilizing the 4 or 6 layer copper design with offset stacked structures. Further, a glass weave material may be used in a core laminate in which the conductive structures are embedded, and can be set with design and material that facilitates desirable warp and fill density. Stand-off features may be designed into a bond side of the interposer, which may enable a known bond line z-height using both copper and solder mask thicknesses. Consistent with the above, edge plating can be used to seal the edge of the design stack and mitigate lateral gas leakage. Vias connecting layers of the interposer may blind or buried.

Various embodiments are directed toward an electrical interposer apparatus having stacked barrier layers between opposing (first and second) surface layers. Each surface layer includes electrical connectors that provide electrical connectivity through the interposer. Each barrier layer includes conductive traces laterally surrounded by and coplanar with conductive barrier material, which is offset from the conductive traces by a continuous gap extending around the conductive traces. Each conductive trace includes respective via pads connected by a connector, and a conductive vias connect one of the via pads of stacked pairs of the conductive traces in the respective barrier layers. The conductive traces have a width that varies along their length, with stacked ones of the conductive traces being arranged such that the respective gaps extending around each stacked pair are offset from one another along the majority of the respective lengths of the gaps.

Differently-shaped or arranged conductive traces can be stacked such that vertical paths (relative to the lateral layers) through the gaps within the interposer are reduced or eliminated. For instance, the connector of each conductive trace may extend in an arc between the respective via pads of the conductive trace, and stacked ones of the connectors may be arranged to arc in opposing lateral directions, such that the connectors (and the gaps around the connectors) do not overlap.

In some embodiments, the respective barrier layers are parallel to one another, and the conductive traces are stacked vertically in pairs with vertically aligned via pads that are connected to one another. An outer perimeter of each of the pairs of stacked traces is predominantly laterally offset, relative to the outer perimeter of the other one of the pair of stacked traces. For instance, the connected via pads may be shaped and sized differently, such that the outer perimeters minimally overlap. In other embodiments in which via pads of the stacked conductive traces are vertically aligned, the gaps around the respective stacked conductive traces are predominantly laterally offset from one another.

The gaps may be arranged in a variety of manners. For instance, the gap for each conductive trace may be defined by an outer perimeter edge of the conductive trace and an inner perimeter edge of a portion of the conductive barrier material laterally surrounding the conductive trace. Further, the respective gaps may be sufficiently large to prevent electrical conduction between the conductive barrier material and the conductive traces, and may further include insulative material.

Various embodiments further include an insulation layer stacked between the first and second barrier layers, and arranged to prevent electrical conduction between the respective layers, other than that conducted by the vias (e.g., passing power and/or signals between respective ones of the via pads in stacked pairs of the conductive traces). Such an insulation layer may further mitigate gas permeation. For instance, the insulation layer may include a woven material having a plurality of stacked fibers. Such stacked fibers may be arranged in an offset pattern relative to one another, which mitigates gas permeation through the insulation layer. The surface layers, barrier layers and insulation layer may thus be stacked vertically, with the stacked fibers arranged in an offset pattern relative to one another such that substantially no vertical path through the insulation layer is devoid of one of the stacked fibers.

Various methods may be carried out, in accordance with the above. In accordance with one or more aspects of the disclosure, a method involves forming an interposer having respective barrier layers having barrier material that is coplanar with, and laterally surrounds, traces with connected via pads. Vias are formed to connect pads of stacked pairs of the traces in respective ones of the barrier layers. The traces are formed with a varied width along their respective lengths, in a manner that may be utilized to mitigate gas permeation. Specifically, the barrier material is formed offset from each trace by a continuous gap having a length extending around the trace, with the gaps extending around each stacked pair being offset from one another along the majority of their respective lengths. For instance, the gap may be set by forming an outer perimeter edge of the conductive trace and an inner perimeter edge of a portion of the conductive barrier material laterally surrounding the conductive trace. Further, the gaps may be formed sufficiently large to prevent electrical conduction between the conductive barrier material and the conductive traces. This offset nature of the stacked gaps can be used to mitigate the gas permeation. The method may further include forming first and second surface layers on opposing sides of the stacked barrio layers, the surface layers having a plurality of electrical connectors connected to one of the via pads of the conductive traces in the barrier layer upon which it is formed. Each electrical connector is thus connected to a different one of the via pads to provide a conductive path.

Consistent with the above, forming the barrier layers may include forming the connectors of each conductive trace extending in an arc between the respective via pads of the conductive trace. This may be carried out such that the connectors of the respective stacked pairs of conductive traces arc in opposite lateral directions.

In some implementations, the pairs of the conductive traces are stacked vertically with the respective first and second layers parallel to one another, and via pads of respective ones of the pair of stacked conductive traces are aligned to one another. The outer perimeters of the pair of conductive traces are formed such they are predominantly laterally offset from one another. In certain implementations involving such vertical stacking, via pads in each one of the stacked conductive traces are aligned with a via pad of the conductive trace with which it is stacked, and the gaps around the stacked conductive traces are laterally offset from one another.

An insulation layer may also be formed, stacked between the first and second barrier layer, and including a woven material having a plurality of stacked fibers. The fibers are stacked in an offset pattern relative to one another, to mitigate gas permeation through the insulation layer.

Figure 1C:
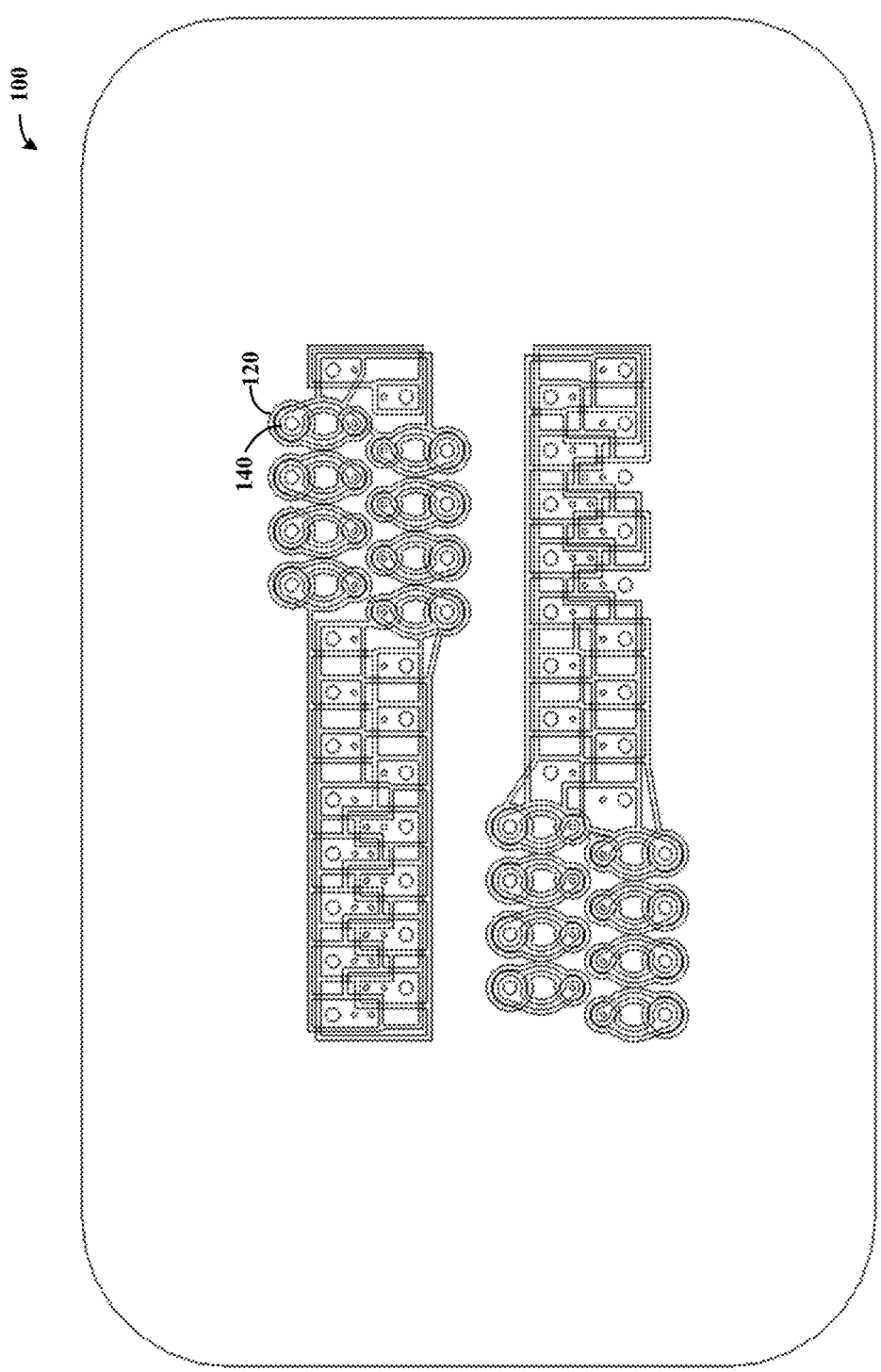

Turning now to the figures, FIGS. 1A-1C show respective views of an apparatus 100, as may be implemented in accordance with one or more embodiments. FIG. 1A shows a top view of a first layer 101 within the apparatus 100, which may be implemented as an interposer. A plurality of conductive components are offset from a conductive barrier material by gaps. Labeled by way of example, the first layer 101 includes conductive barrier material 103, rectangular traces 110 and 112, and arced traces 120 and 122. Referring specifically to trace 120, two respective via pads 124 and 126 are connected by an arced connector 128, and the entire trace is insulated from surrounding barrier material 102 by a gap 130.

FIG. 1B shows a top view of a second layer 102 within the apparatus 100, also including a plurality of conductive components offset from a conductive barrier material by gaps. Labeled by way of example, the second layer 102 includes conductive barrier material 104, rectangular traces 114 and 116, and arced trace 140. Referring specifically to trace 140, two respective vias 144 and 146 are connected by an arced connector 148, and the entire connector is insulated from surrounding barrier material 104 by a gap 132.

FIG. 1C shows a top view of the first layer 101 and second layer 102 in a stacked arrangement in which arced traces 120 and 140 are stacked as a pair. A via connects the paired arced traces to one another on vertically-arranged ones of the via pads, with the other respective via pad in each of the paired arced traces being available for further connection, such as to an interface or to another stacked layer.

Figure 2:
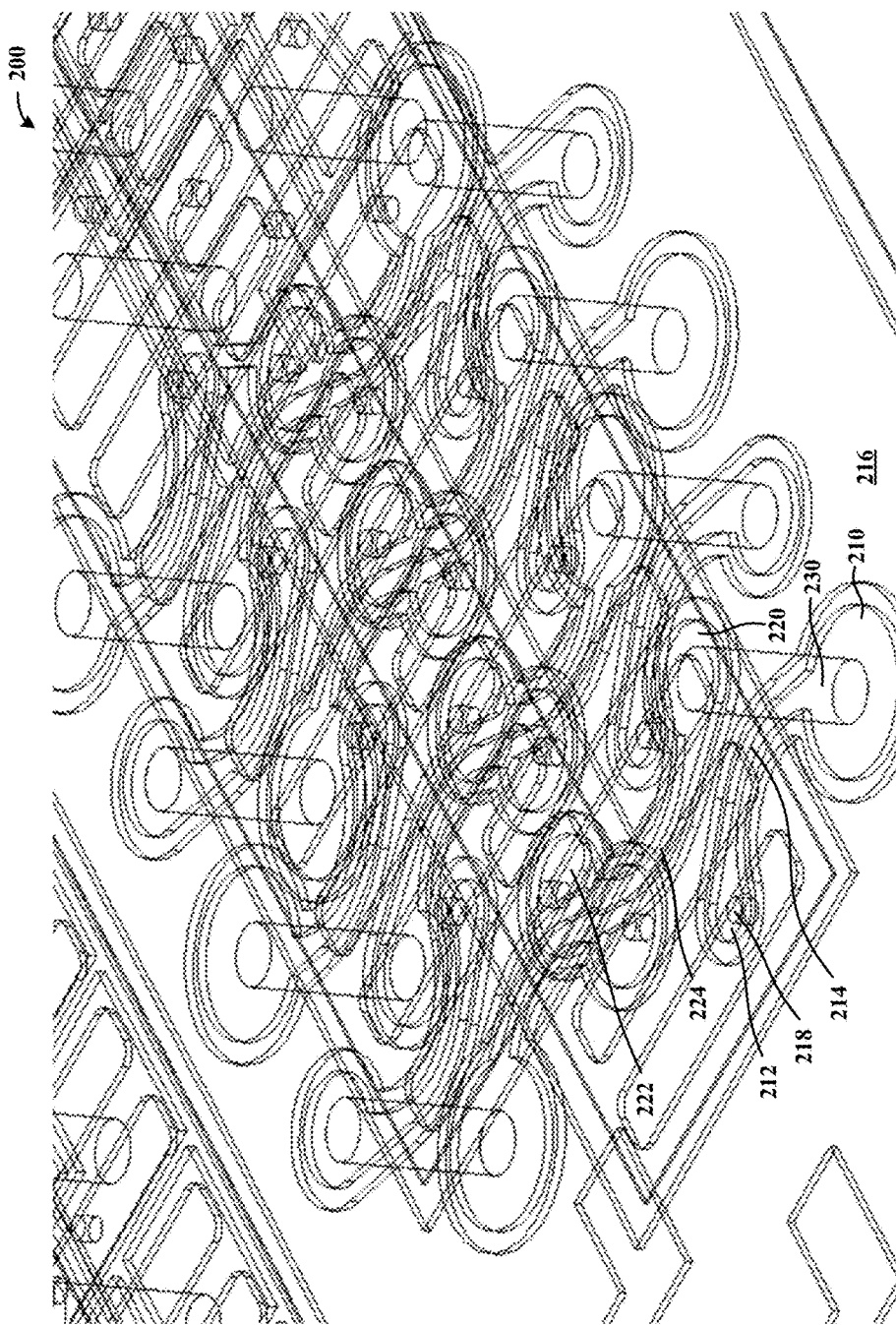
FIG. 2 shows a perspective view of an interposer, as may be implemented in accordance with one or more embodiments.

FIG. 2 shows a perspective view of stacked interposer layers in an arrangement 200, as may be implemented in accordance with one or more embodiments. The stacked interposer layers may, for example, be implemented in accordance with layers 101 and 102 as shown in FIGS. 1A-1C. Each layer includes a plurality of arced traces, with a stacked pair of such traces labeled by way of example. A first arced trace in the lower layer includes via pads 210 and 212 connected by an arced connector 214, and surrounded by a conductive barrier layer 216. The via pad 210 is connected by via 230 to a via pad 220 of a second arced trace stacked above in an upper layer, which also includes via pad 222 connected to via pad 220 by an arced connector 224. Via pads 212 and 222 are connectable to further layers or other componentry, such as an external connector, and may utilize a further via such as via 218 (e.g., extending downward from the lower layer). The stacked arced traces respectively arc in opposite directions, mitigating the gas permeation through the arrangement.

Figure 3:
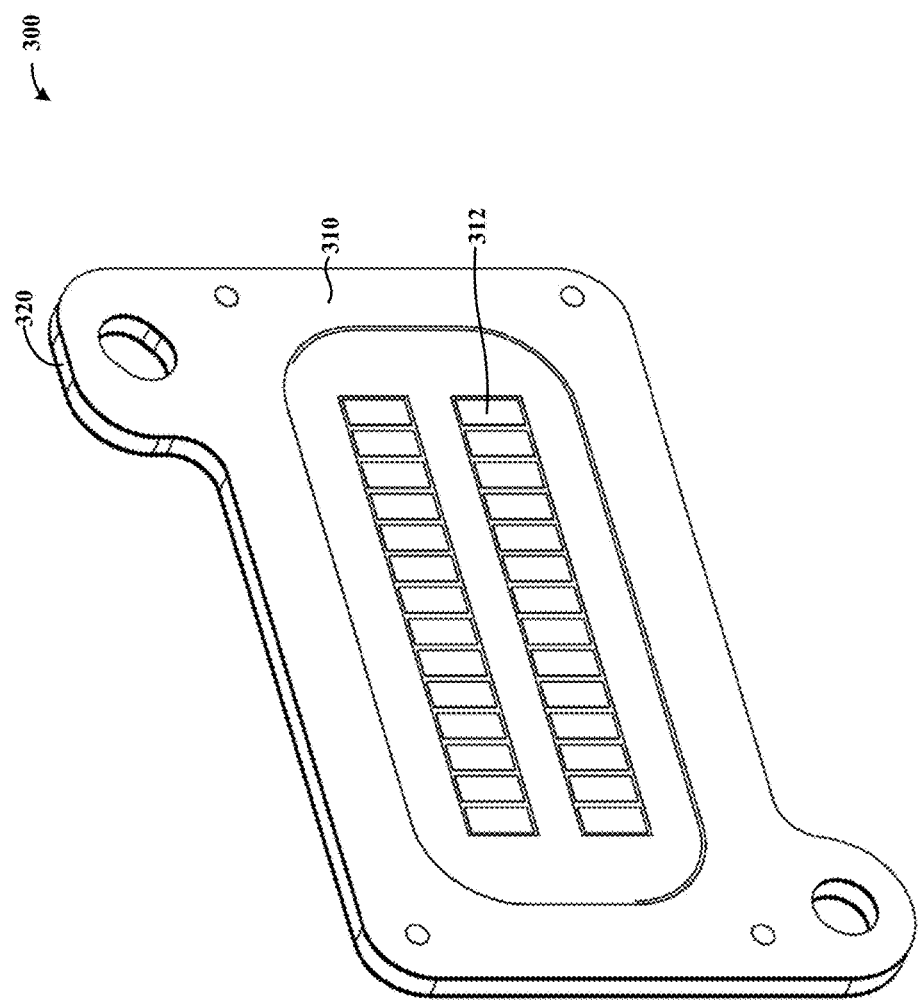
FIG. 3 shows a perspective view of an interposer with an external connector, as may be implemented in accordance with one or more embodiments.

FIG. 3 shows a perspective view of an interposer 300, as may be implemented in accordance with one or more embodiments. The interposer 300 includes stacked layers with offset conductors that mitigate gas permeation, such as shown in FIGS. 1A-1C. Surface 310 is shown with respective connectors including connector 312 labeled by way of example, which may facilitate coupling to external connectors. Such connectors may, for example, be connected to via pads by vias such as via 218 shown in FIG. 2. The edge 320 of the interposer 300 may be sealed, such as with a metal or other plating material that mitigates gas permeation.

Figure 4:
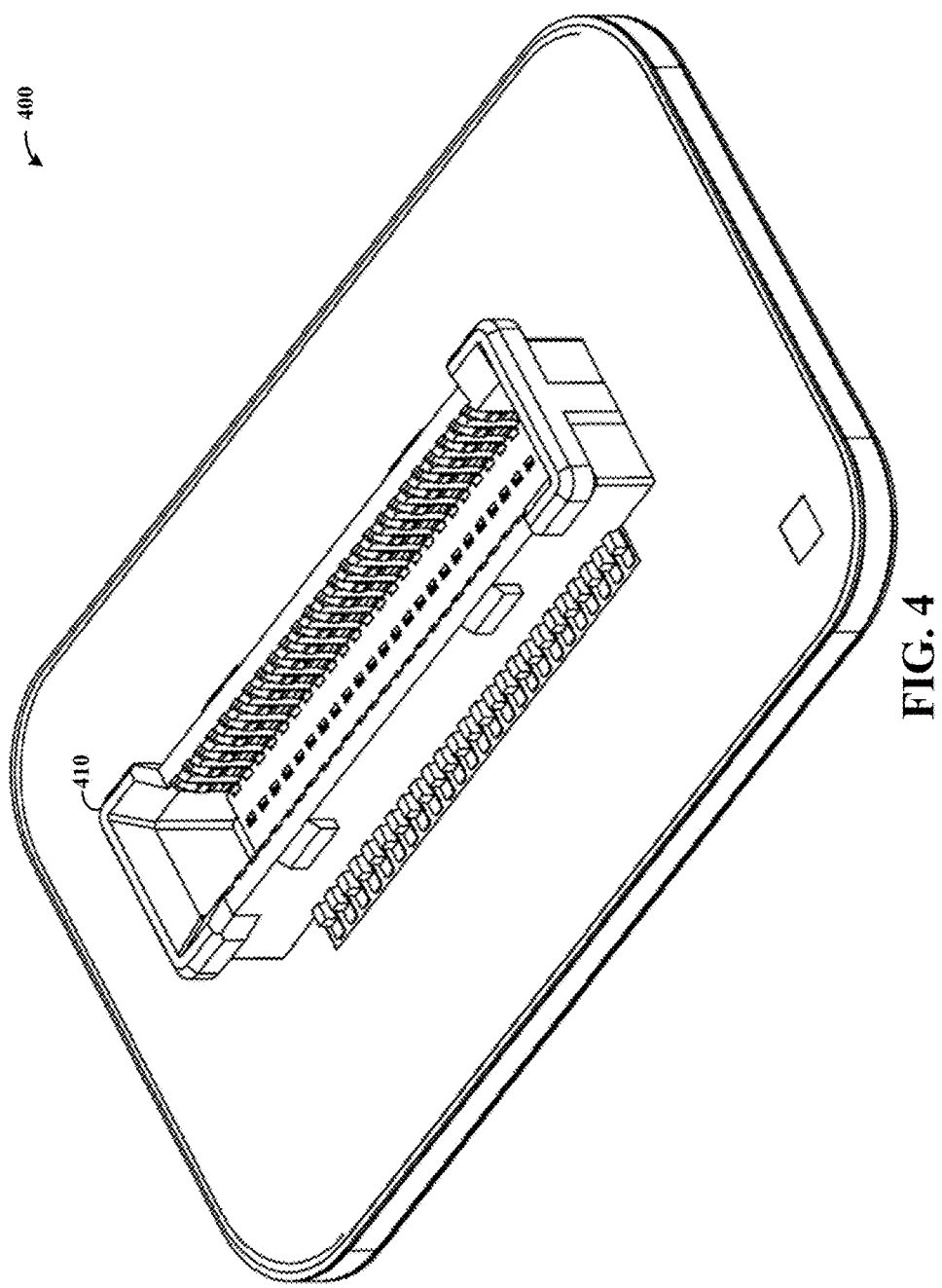
FIG. 4 shows a perspective view of stacked interposer layers, as may be implemented in accordance with one or more embodiments.

FIG. 4 shows a perspective view of an interposer 400 with an external connector 410, as may be implemented in accordance with one or more embodiments. The interposer 400 includes stacked layers with offset conductors that mitigate gas permeation. As such, the interposer 400 may be implemented with stacked layers such as those shown in FIGS. 1A-1C, and in FIG. 2. Further, the electrical connector 410 may be coupled to surface connectors such as those shown in FIG. 3.

A variety of different types of materials may be utilized between barrier layers and in gaps within barrier layers, including those around conductive traces. For instance EM285 laminate material available from Elite Material Co., Ltd., of Taiwan, with a core weave of 7628 and outer layers having a weave of 1080 can be used to suit particular applications. Multiple layers of these or other materials can be used. Further, each layer may be aligned differently, relative to the other layers (e.g., four layers, with a first layer followed by three additional layers stacked thereupon that are each rotated 10 degrees relative to an underlying layer).

Figure 5:
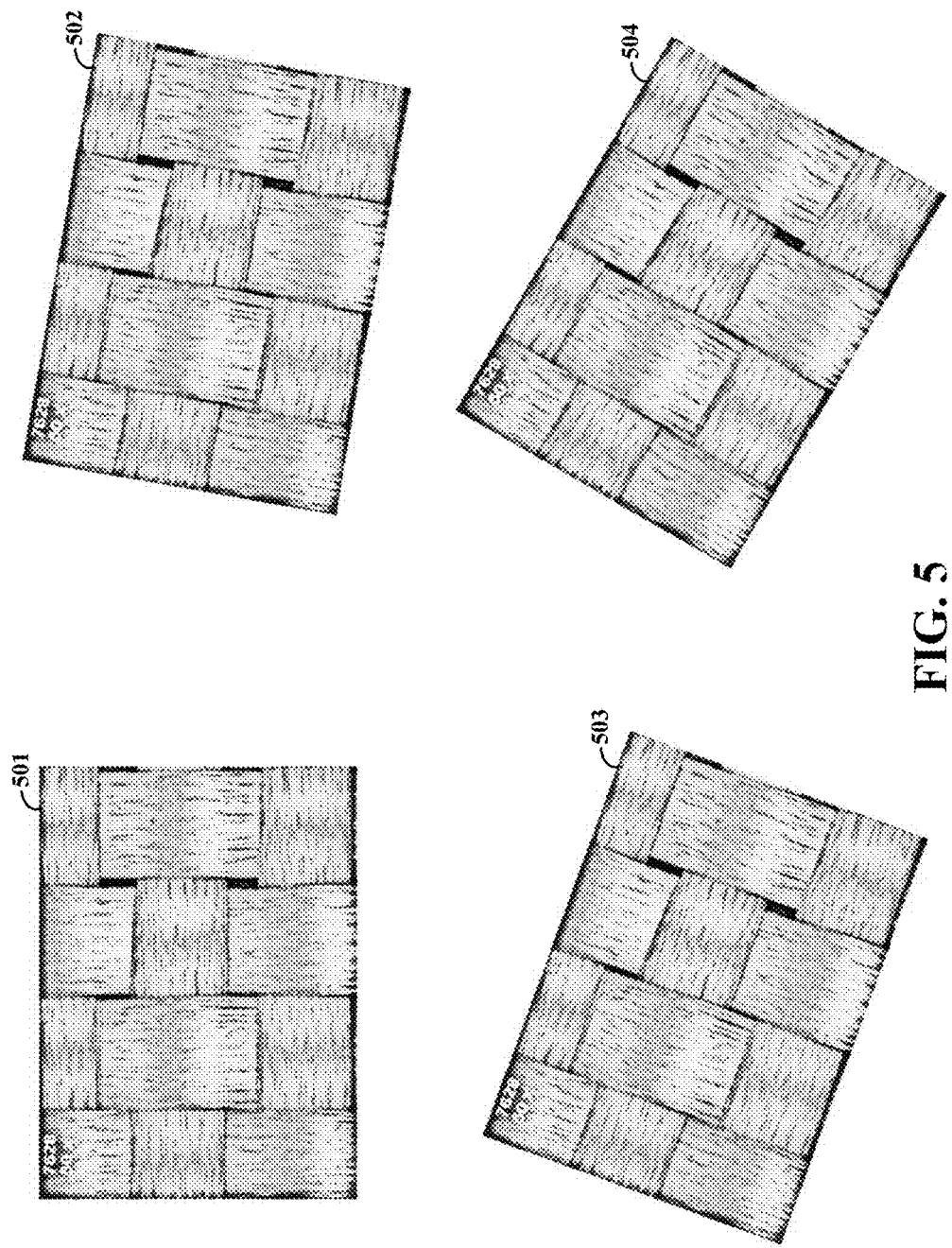
FIG. 5 shows an exploded view of a four-layer woven material, as may be implemented in accordance with one or more embodiments.

FIG. 5 shows an exploded view of a four-layer woven material, as may be implemented in accordance with one or more embodiments. Four layers are shown, including a bottom layer 501 and respective layers 502, 503 and 504 that are respectively stacked upon the bottom layer (e.g., in that order). Each layer is rotated relative to the other layers, with the rotation facilitating the mitigation of gas permeation through the woven layers. Such layers may, for example, be stacked such that each layer is rotated 10 degrees clockwise from the layer upon which it is stacked, such that layer 502 is rotated 10 degrees relative to layer 501, layer 503 is rotated 10 degrees relative to layer 502, and layer 504 is rotated 10 degrees relative to layer 503.

Based upon the above discussion and illustrations, those skilled in the art will readily recognize that various modifications and changes may be made to the present disclosure without strictly following the exemplary embodiments and applications illustrated and described herein. For example, different shaped connectors may be utilized to provide an offset structure that mitigates gas permeation. Additional layers can be used, with offset connectors to further mitigate gas permeation. Further, while various example materials, sizes and arrangements are shown in the figures and/or described, such aspects may be implemented in embodiments involving other materials, sizes or arrangements. Such modifications do not depart from the true spirit and scope of the present disclosure, including that set forth in the following claims.

What is claimed is:

1. An electrical interposer apparatus comprising:
    a first surface layer having a plurality of electrical connectors;
    a second surface layer having a plurality of electrical connectors, the first and second surface layers being on opposite sides of the electrical interposer;
    first and second barrier layers stacked between the first surface layer and the second surface layer, each of the barrier layers including:
        a plurality of conductive traces, each conductive trace including respective via pads connected by a connector and having a width that varies along its length, and
        conductive barrier material that is coplanar with and laterally surrounds the conductive traces, the conductive barrier material being offset from the plurality of conductive traces by a continuous gap having a length extending around the conductive traces; and
    a plurality of conductive vias that connect the via pads of stacked pairs of the conductive traces, one of the stacked pairs being in the first barrier layer and the other of the stacked pairs being in the second barrier layer, wherein the respective gaps extending around each stacked pair are offset from one another along the majority of the respective lengths of the gaps.

2. The apparatus of claim 1, wherein the connector of each conductive trace extends in an arc between the respective via pads of the conductive trace.

3. The apparatus of claim 1, wherein
    the connector of each conductive trace extend in an arc between the respective via pads of the conductive trace, and
    the connectors of the respective stacked pairs of conductive traces arc in opposite lateral directions.

4. The apparatus of claim 1, wherein
    the stacked pairs of the conductive traces are stacked vertically;
    the respective first and second barrier layers are parallel to one another; and
    for each pair of stacked conductive traces, each via pad of one of the conductive traces is vertically aligned with a via pad of the other one of the conductive traces, and an outer perimeter of each conductive trace is predominantly laterally offset, relative to the outer perimeter of the other one of the conductive traces.

5. The apparatus of claim 1, wherein
    the via pad of each one of the stacked conductive traces is vertically aligned with a via pad of the conductive trace with which it is stacked, and
    the gap around each one of the stacked conductive traces is predominantly laterally offset, relative to the gap around the other one of the pair of stacked conductive traces.

6. The apparatus of claim 1, wherein the gap for each conductive trace is defined by an outer perimeter edge of the conductive trace and an inner perimeter edge of a portion of the conductive barrier material laterally surrounding the conductive trace.

7. The apparatus of claim 1, wherein the respective gaps are sufficiently large to prevent electrical conduction between the conductive barrier material and the conductive traces.

8. The apparatus of claim 1, further including an insulation layer stacked between the first and second barrier layers and configured and arranged to prevent electrical conduction between the in the first barrier layer and the second barrier layer, while the vias conduct signals between respective ones of the via pads in the stacked pairs of the conductive traces.

9. The apparatus of claim 8, wherein the insulation layer includes a woven material having a plurality of stacked fibers.

10. The apparatus of claim 9, wherein the stacked fibers are configured and arranged in an offset pattern, relative to one another, which mitigates gas permeation through the insulation layer.

11. The apparatus of claim 9, wherein
    the surface layers, barrier layers and insulation layer are stacked vertically; and
    the stacked fibers are configured and arranged in an offset pattern, relative to one another, such that substantially no vertical path through the insulation layer is devoid of one of the stacked fibers.

12. A method of manufacturing an electrical interposer apparatus, the method comprising:
    forming first and second barrier layers, each of the barrier layers including:
        a plurality of conductive traces, each conductive trace including respective via pads connected by a connector and having a width that varies along its length, and
        conductive barrier material that is coplanar with and laterally surrounds the conductive traces, the conductive barrier material being offset from the plurality of conductive traces by a continuous gap having a length extending around the conductive traces; and
    forming a plurality of conductive vias that connect the via pads of stacked pairs of the conductive traces, one of the stacked pairs being in the first barrier layer and the other of the stacked pairs being in the second barrier layer, wherein the respective gaps extending around each stacked pair are offset from one another along the majority of the respective lengths of the gaps.

13. The method of claim 12, further including:
    forming a first surface layer having a plurality of electrical connectors, and connecting each of the electrical connectors to one of the via pads of the conductive traces in the first barrier layer, each electrical connector being connected to a different one of the via pads; and
    forming a second surface layer having a plurality of electrical connectors and connecting each of the electrical connectors to one of the via pads of the conductive traces in the second barrier layer, each electrical connector being connected to a different one of the via pads.

14. The method of claim 12, wherein forming the first and second barrier layers includes forming the connectors of each conductive trace extending in an arc between the respective via pads of the conductive trace.

15. The method of claim 12, wherein forming the first and second barrier layers includes forming the connector of each conductive trace extending in an arc between the respective via pads of the conductive trace, with the connectors of the respective stacked pairs of conductive traces arc extending in opposite lateral directions.

16. The method of claim 12, wherein forming the first and second barrier layers includes:

stacking the pairs of the conductive traces vertically with the respective first and second layers parallel to one another; and for each pair of stacked conductive traces, vertically aligning each via pad of one of the pair of stacked conductive traces with a via pad of the other one of the pair of stacked conductive traces, with an outer perimeter of each conductive trace predominantly laterally offset, relative to the outer perimeter of the other one of the pair of stacked conductive traces.

17. The method of claim 12, wherein forming the first and second barrier layers includes:

vertically aligning the via pad of each one of the stacked conductive traces with a via pad of the conductive trace with which it is stacked, and laterally offsetting the gap around each one of the stacked conductive traces, relative to the gap around the other one of the pair of stacked conductive traces, such that the gaps of the respective stacked conductive traces are predominantly laterally offset from one another.

18. The method of claim 12, wherein forming the first and second barrier layers includes defining the gap for each conductive trace by forming an outer perimeter edge of the conductive trace and an inner perimeter edge of a portion of the conductive barrier material laterally surrounding the conductive trace.

19. The method of claim 12, wherein forming the first and second barrier layers includes forming the gaps sufficiently large to prevent electrical conduction between the conductive barrier material and the conductive traces.

20. The method of claim 12, further including forming an insulation layer stacked between the first and second barrier layers and including a woven material having a plurality of stacked fibers, by stacking the fibers in an offset pattern, relative to one another, to mitigate gas permeation through the insulation layer.

* * * * *